United States Patent
Kobayashi

(10) Patent No.: US 6,888,196 B2
(45) Date of Patent: May 3, 2005

(54) VERTICAL MOSFET REDUCED IN CELL SIZE AND METHOD OF PRODUCING THE SAME

(75) Inventor: Kenya Kobayashi, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 23 days.

(21) Appl. No.: 10/421,830

(22) Filed: Apr. 24, 2003

(65) Prior Publication Data

US 2004/0021174 A1 Feb. 5, 2004

(30) Foreign Application Priority Data

Apr. 24, 2002 (JP) ........................................ 2002-121979

(51) Int. Cl.$^7$ ............................................... H01L 29/76
(52) U.S. Cl. ...................... 257/330; 257/328; 257/329; 257/331; 438/259; 438/270; 438/271; 438/589
(58) Field of Search ................................ 257/117, 244, 257/301–305, 330–334; 438/259, 270, 271, 589

(56) References Cited

U.S. PATENT DOCUMENTS 6,603,173 B1 * 8/2003 Okabe et al. ............... 257/330

FOREIGN PATENT DOCUMENTS

| JP | A 10-223891 | 8/1998 |
| JP | A 2000-223708 | 8/2000 |
| JP | 2001-223358 | 8/2001 |
| JP | 2001-250947 | 9/2001 |

OTHER PUBLICATIONS

B. Jayant Baliga, "Power Semiconductor Devices," Chapter 7, PWS Publishing Company, 1996, pp. 367–373.
Satoshi Matsumoto et al., "A High–Performance Self–Aligned UMOSFET with a Vertical Trench Contact Structure," IEEE Transactions on Electron Devices, V. 41, 1994, pp. 814–818.

Akihiko Osawa et al., "2.5V–Driven Nch 3rd Generation Trench Gate MOSFET," Proceedings of International Symposium on Power Semiconductor Devices and ICs, IEEE, 1999, pp. 209–212.

Sang–Gi Kim et al., "Trench Corner Rounding Technology Using Hydrogen Annealing for Highly Reliable Trench DMOSFETs," Proceedings of International Symposium on Power Semiconductor Device and ICs, IEEE, 2000, Catalog No.: 00CH37094C, pp. 87–90.

* cited by examiner

*Primary Examiner*—David Nelms
*Assistant Examiner*—Andy Huynh
(74) *Attorney, Agent, or Firm*—Young & Thompson

(57) ABSTRACT

In a vertical MOSFET comprises: a semiconductor layer (1, 2, 9, 10) having first and second surfaces opposite to each other and trenches (6) formed on the first surface; trench gates (8) formed in the trenches; a unit cell formed in a region of the semiconductor layer surrounded by the trench gates, the unit cell comprising a base layer (9) and a source layer (10) formed on the base layer and having the first surface as a principal semiconductor surface, the unit cell having a contact hole (12) formed on a center of the principal semiconductor surface and extending from the principal semiconductor surface through the source layer to an inside of the base layer; a contact (17) formed in the contact hole; a source electrode (18) formed on the contact; and a drain electrode (19) formed on the second surface, the contact is formed to a depth different to a peak depth which is a position having a maximum impurity-concentration in a depth direction of the base layer. The unit call further comprises a base contact layer (14) formed within the base layer so as to enclose a bottom of the contact and to bring the base contact layer into contact with the bottom of the contact.

6 Claims, 11 Drawing Sheets

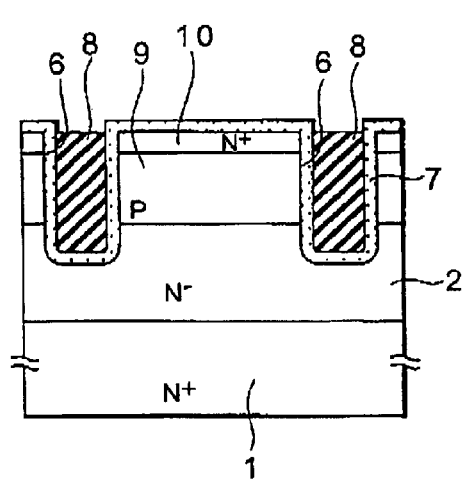
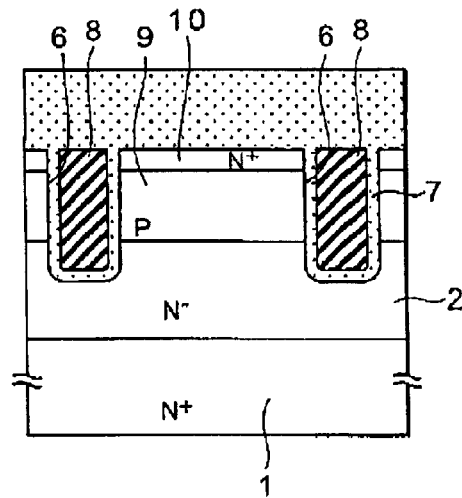
FIG.7A          FIG.7B
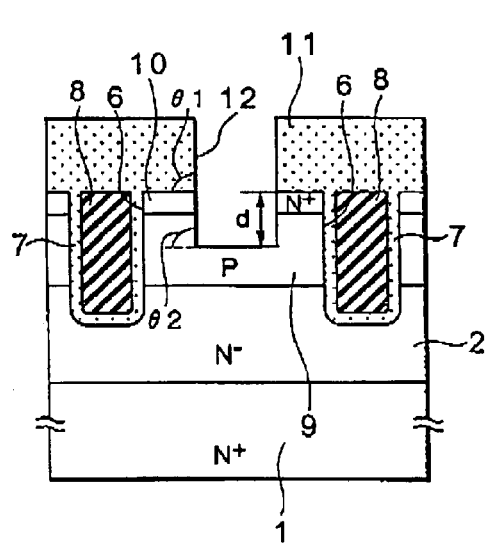
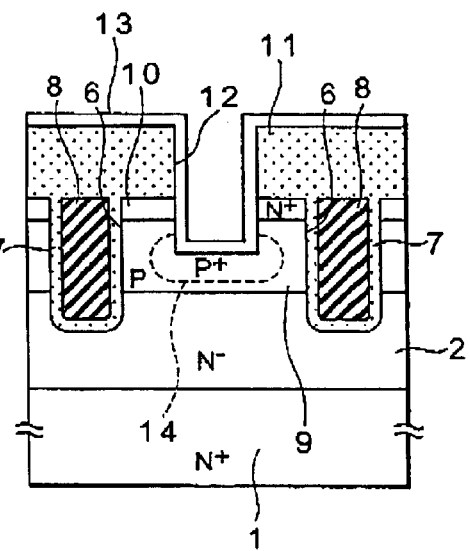
FIG.7C          FIG.7D

VERTICAL MOSFET REDUCED IN CELL SIZE AND METHOD OF PRODUCING THE SAME

BACKGROUND OF THE INVENTION

This invention relates to a vertical MOSFET (Metal Oxide Semiconductor Field Effect Transistor) reduced in cell size and, in particular, to a MOSFET (UMOSFET) with a gate electrode formed in a U-shaped trench and a method of producing the same.

An orthogonal field effect transistor (MOSFET) is a device used in the field of power electronics. Depending upon an apparatus to which the vertical MOSFET is applied, a breakdown voltage (drain-source breakdown voltage: BVdss) between several tens to several hundreds of volts (V) is required. In addition, there is technical trend towards low power consumption by reducing an on-resistance (Ron) during an on-period (during operation), high-speed operation by reducing a parasitic capacitance and a parasitic resistance, improvement of breakdown resistance in a severe operation environment, and improvement of trade-off among these characteristics.

In order to reduce the on-resistance while maintaining a breakdown voltage of a required level, it is necessary to reduce each resistance component in a vertical MOSFET structure. In case of an existing N-channel double-diffusion MOSFET (DMOSFET), resistance components of the on-resistance Ron are given by Equation (1) as described on page 368 in "Power Semiconductor Devices" (written by B. JAYANT BALIGA and published by PWS Publish Company, 1996).

$$Ron = R(N+) + R(CH) + R(A) + R(J) + R(D) + R(S), \quad (1)$$

where $R(N+)$ represents the resistance component in an $N^+$ source layer, $R(CH)$, in a channel region, $R(A)$, in an accumulation layer, $R(J)$, in a parasitic junction FET region, $R(D)$, in a drain drift layer, and $R(S)$, in a silicon substrate region. However, it is known that $R(N+)$ and $R(A)$ make small contribution as compared with the remaining resistance components.

In recent years, a MOSFET (UMOSFET) with a gate electrode formed in a U-shaped trench is increasingly commercialized because the on-resistance is further reduced as compared with the existing DMOSFET. In the UMOSFET, $R(J)$ is not present in its structure. Equation (1) is rewritten into Equation (2) only with significant terms.

$$Ron \approx R(CH) + R(D) + R(S). \quad (2)$$

In fact, a source Al (aluminum) resistance depending upon a chip layout and a bonding wire resistance upon mounting are present at a product level. However, in comparison of performance standardized or normalized at a chip level, discussion is often made about those components in Equation (2).

Description will now be made of techniques for reducing the respective resistance components. $R(CH)$ can be reduced by miniaturizing MOSFET cells connected in parallel to improve a current density per unit area. $R(D)$ can be reduced in the following manner. Generally, an epitaxial layer grown on a silicon substrate is used as a drift layer. Therefore, $R(D)$ can be reduced by reducing the thickness of the epitaxial layer or by increasing an impurity concentration. At the same time, however, it is essential to provide a measure for maintaining a breakdown voltage. $R(S)$ can be reduced by reducing the thickness of the silicon substrate or by increasing the impurity concentration. In an application field relatively high in working voltage (for example, 100V or more), the ratio of $R(D)$ is very high. On the other hand, in an application field relatively low in working voltage (for example, 100V or less), $R(CH)$ and $R(D)$ are predominant. At a yet lower working voltage, the ratio of $R(CH)$ is greatest.

Various structures and processes have been proposed for miniaturization of the cells, which is a technique for mainly reducing $R(CH)$ among the above-mentioned resistance components. For example, a technique is proposed for realizing a cell pitch of 3 to 4 $\mu$m (Satoshi Matsumoto et al, "A high-performance self-aligned UMOSFET with a vertical trench constant structure", IEEE Transaction on Electron Devices, Vol. 41, No. 5, pages 814–818, May 1994). Specifically, in addition to a UMOSFET structure with a gate electrode formed in a trench, another trench is formed in a source diffusion layer and filled with W (tungsten) to provide a source contact structure. Description will hereinafter be made of one example of the UMOSFET structure utilizing the above-mentioned technique with reference to FIG. 1.

Referring to FIG. 1, on one surface of an $N^+$-type silicon substrate 401, an $N^-$-type epitaxial layer 402 is formed. On a surface of the $N^-$-type epitaxial layer 402, a P-type base layer 409 and an $N^+$-type source layer 410 are successively formed. In each of trenches reaching the $N^-$-type epitaxial layer 402 through the P-type base layer 409, a gate oxide film 407 and a polysilicon 408 are filled. On the polysilicon 408 to serve as gate electrodes or trench gates, an oxide film 411 is formed by local oxidization of silicon (LOCOS). Between the trench gates, a contact hole 412 is formed to reach the P-type base layer 409 through the $N^+$-type source layer 410. Directly under the contact hole 412, a $P^+$-type base contact layer 414 is formed. Inside the contact hole 412, W 417 is filled by local or selective CVD (chemical vapor deposition). On the oxide film 411 and W 417, a source electrode 418 of Al is formed. On the other surface of the $N^+$-type silicon substrate 401, a Cr—Ni—Ag (chromium-nickel-silver) drain electrode 419 is formed.

The above-mentioned structure is advantageous in the following respects. A source contact region can be determined by LOCOS self-alignment. Furthermore, the $P^+$-type base contact layer 414 can be formed by self-alignment with the contact region. Therefore, a photolithography process requiring two masking steps is unnecessary. Thus, a space between the trench gate and the contact can be designed without considering pattern displacement. As a consequence, it is possible to miniaturize the cell. It is also possible to narrow the contact width by filling W. On the other hand, the above-mentioned structure is disadvantageous in the following respects. Actually, the polysilicon and the gate oxide film in the trench have irregularities left on their surfaces. It is therefore difficult to form the oxide film by LOCOS or to control the thickness of the oxide film, Generally, bird's beak in LOCOS has a length substantially equivalent to the thickness. Therefore, restriction is imposed upon the space between the trench gate and the contact. In addition, the local CVD of W requires an underlying pattern of Ti (titanium), Mo (molybdenum), or the like. In order to form the underlying pattern, the photolithography process is required.

On the other hand, a structure is disclosed in which aluminum is filled by a high-temperature process (up to 500° C.) in a source contact region of a UMOSFET similar to that mentioned above (Akihiko Osawa et al, "2.5V-driven Nch 3rd generation trench gate MOSFET," Proceedings of International Symposium on Power Semiconductor Devices and ICs, pages 209–212, 1999). In this structure, the cell pitch is reduced to ½ as compared with an existing structure. Furthermore, Japanese Unexamined Patent Publication No. 2000-223708 (JP 2000-223708 A) discloses a UMOSFET structure similar to the above-mentioned structure in which aluminum is filled and a method of producing the same. The UMOSFET structure utilizing the above-mentioned technique will hereinafter be described with reference to FIG. 2.

Referring to FIG. 2, on one surface of an $N^+$-type silicon substrate 501, an $N^-$-type epitaxial layer 502 is formed. On a surface of the $N^-$-type epitaxial layer 502, a P-type base layer 509 and an $N^+$-type source layer 510 are successively formed. In each of trenches reaching the $N^-$-type epitaxial layer 502 through the P-type base layer 509, a gate oxide film 507 and a polysilicon 508 are filled. On the polysilicon 508 to serve as gate electrodes or trench gates, an interlayer oxide film 511 is formed. Between the trench gates, a contact hole 512 is formed to reach the P-type base layer 509 through the $N^+$-type source layer 510. Directly under the contact hole 512, a $P^+$-type base contact layer 514 is formed. Inside the contact hole 512, TiW (titanium tungsten) 56 is deposited to extend onto the interlayer oxide film 511. On the TiW 516, a source electrode 518 of Al is formed, On the other surface of the $N^+$-type silicon substrate 501, a drain electrode 519 is formed.

The above-mentioned structure is advantageous in the following respects. It is possible to obtain the contact with the $N^+$-type source layer 510 at a side wall of the contact hole 512 and to obtain the contact with the $P^+$-type base contact layer 514, i.e., with the P-type base layer 509, at a bottom of the contact hole 512. Therefore, a photolithography process of forming the $P^+$-type base contact layer 514 is unnecessary. However, the above-mentioned structure is disadvantageous in the following respects. In case where the high-temperature process is used to form Al, a special process is required. In addition, in case of typical Al sputtering at a temperature of 100 to 300° C., the coverage is inferior. If a contact hole is small, a void is produced and the contact hole can not sufficiently be filled. As a consequence, restriction is imposed upon a design of the contact width. Even if the contact hole is filled, a surface profile becomes irregular when the Al coverage is inferior. Therefore, a source Al resistance depending upon the chip layout may possibly be increased.

As described in the foregoing, the structures in FIGS. 1 and 2 have some advantages but yet have the above-mentioned disadvantages. Furthermore, there is another disadvantage in common to both of the structures. Specifically, when the $P^+$-type contact layer is formed at the bottom of the contact hole, the impurity concentration in a channel region is increased by lateral or horizontal diffusion. Therefore, a threshold voltage (Vt) is increased. In order to prevent the increase of Vt, it is necessary to widen the space between the trench gate and the contact. As a consequence, miniaturization of the cell can not be achieved. Since the contact with the $N^+$-type source layer is obtained at the side wall of the contact hole, the contact resistance may possibly be increased because the impurity concentration is lowered at the side wall than at the top. In other words, R(N+) small in contribution as compared with the remaining resistance components as described in conjunction with Equation (1) can not negligible. This results in an increase of Ron.

SUMMARY OF THE INVENTION

It is an object of this invention to provide a vertical MOSFET reduced in cell size without increasing Vt or a source resistance in case where a trench contact structure with a trench formed in each of a source layer and a base layer is used in a UMOSFET as the vertical MOSFET.

It is another object of this invention to provide a method of producing a vertical MOSFET reduced in cell size without increasing Vt or a source resistance in case where a trench contact structure with a trench formed in each of a source layer and a base layer is used in a UMOSFET as the vertical MOSFET.

Vertical MOSFETs according to this invention and methods according to this invention are as follows:

Structure 1. A vertical MOSFET (or a UMOSFET) comprising: a semiconductor layer (1, 2, 9, 10) having first and second surfaces opposite to each other and a pair of trenches (6) formed on the first surface; a pair of trench gates (8) formed in the pair of trenches; a unit cell formed in a region of the semiconductor layer surrounded by the pair of trench gates, the unit cell comprising a base layer (9) and a source layer (10) formed on the base layer and having the first surface as a principal semiconductor surface, the unit cell having a contact hole (12) formed on a center of the principal semiconductor surface and extending from the principal semiconductor surface through the source layer to an inside of the base layer; a contact (17) formed in the contact hole; a source electrode (18) formed on the contact; and a drain electrode (19) formed on the second surface; wherein the contact is formed to a depth different to a peak depth which is a position having a maximum impurity-concentration in a depth direction of the base layer, the unit call further comprising a base contact layer (14) formed within the base layer so as to enclose a bottom of the contact and to bring the base contact layer into contact with the bottom of the contact.

Structure 2. A vertical MOSFET as described in Structure 1, wherein d and z have a relationship given by $d<z-0.1$ μm or $d>z+0.1$ μm, where d represents the depth of the contact from the principal semiconductor surface and where z represents a the peak depth from the principal semiconductor surface.

Structure 3. A vertical MOSFET as described in Structure 1, wherein the base contact layer is formed within the base layer so as to enclose only the bottom of the contact and to bring the base contact layer into contact with only the bottom of the contact.

Structure 4. A vertical MOSFET as described in Structure 1, wherein the contact hole is with a metal which serves as the contact and has a flattened surface, the source electrode being formed on the flattened surface of the metal and having another flattened surface.

Structure 5. A vertical MOSFET as described in Structure 1, wherein the unit cell further comprising a metal silicide (15) formed between the bottom of the contact and the base contact layer, between a side wall of the contact and the source layer, and between the side wall of the contact and the base layer.

Structure 6. A vertical MOSFET as described in Structure 1, wherein the contact hole has a tapered shape gradually decreased in aperture size from the first surface towards the second surface.

Structure 7. A method of producing a vertical MOSFET (or a UMOSFET) comprising: a semiconductor layer (1, 2, 9, 10) having first and second surfaces opposite to each other and a pair of trenches (6) formed on the first surface; a pair of trench gates (8) formed in the pair of trenches; a unit cell formed in a region of the semiconductor layer surrounded by the pair of trench gates, the unit cell comprising a base layer (9) and a source layer (10) formed on the base layer and having the first surface as a principal semiconductor surface, the unit cell having a contact hole (12) formed on a center of the principal semiconductor surface and extending from the principal semiconductor surface through the source layer to an inside of the base layer; a contact (17) formed in the contact hole; a source electrode (18) formed on the contact; and a drain electrode (19) formed on the second surface; the unit call further comprising a base contact layer (14) formed within the base layer so as to enclose a bottom of the contact and to bring the base contact layer into contact with the bottom of the contact; wherein the method comprises the steps of:

forming the contact hole to a depth different to a peak depth which is a position having a maximum impurity-concentration in a depth direction of the base layer;

forming an oxide film (13) on a side surface of the contact hole and on a bottom surface of the contact hole; and forming the base contact layer by ion implantation of an impurity into the bottom surface of the contact hole through the oxide film.

Structure 8. A method as described in Structure 7, wherein the contact hole is formed to have a tapered shape gradually decreased in aperture size from the first surface towards the second surface.

Structure 9. A method as described in Structure 8, wherein the ion implantation is carried out either in an orthogonal direction with respect to the bottom surface of the contact hole or in a direction inclined by a predetermined angle from the orthogonal direction.

Structure 10. A method as described in Structure 7, further comprising the steps of:

removing the oxide film to expose the contact hole; and forming a metal silicide (15) on the bottom surface of the contact hole and the side surface of the contact hole.

Structure 11. A method as described in Structure 7, further comprising the steps of:

removing the oxide film to expose the contact hole;

filling the contact hole with a metal which serves as the contact and has a flattened surface; and forming the source electrode on the flattened surface of the metal.

According to this invention, the contact is formed to the depth different from the peak depth of the impurity concentration of the base layer. Thus, it is possible to suppress an influence upon a channel region by the impurity of the base contact layer formed at the bottom of the contact and to reduce the cell size without increasing Vt. Furthermore, since the base contact layer is not present on the side wall of the contact, a source layer resistance is not increased. Furthermore, it is possible to flatten the surface of the source electrode and to decrease a bonding resistance.

BRIEF DESCRIPTION OF THE DRAWING

FIGS. 7A to 7D are sectional views for describing a second part of the production process following the first part;

DESCRIPTION OF THE PREFERRED EMBODIMENT

Figure 1:
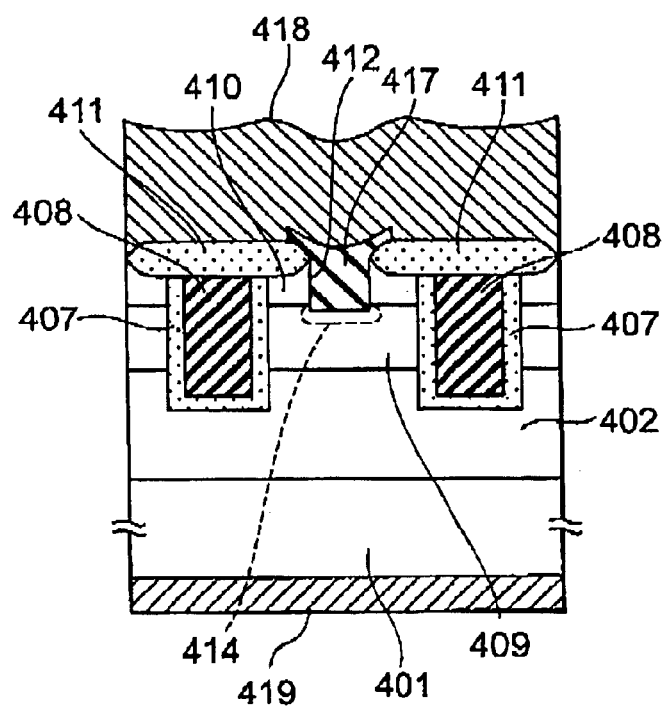
FIG. 1 is a sectional view of a first conventional vertical MOSFET.
Figure 2:
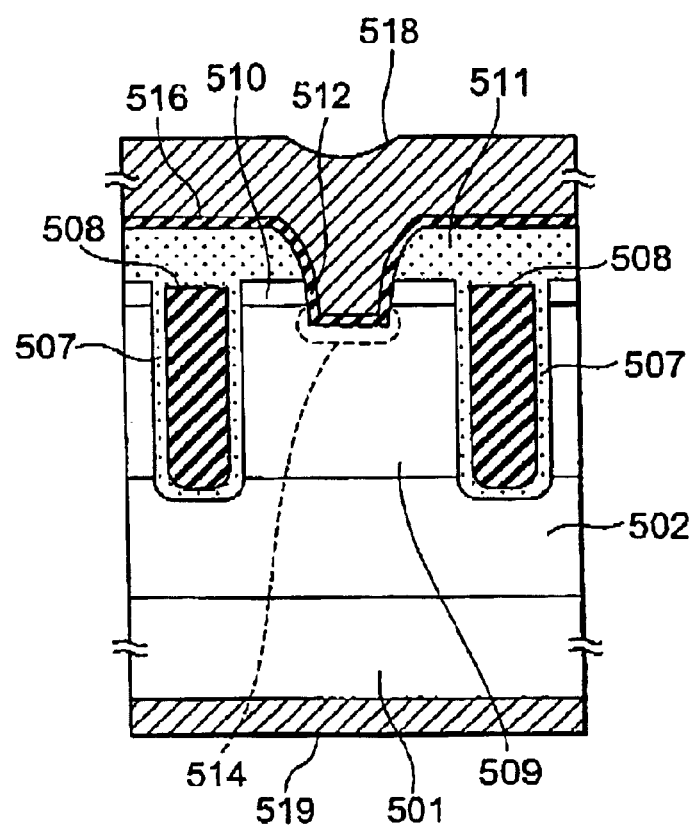
FIG. 2 is a sectional view of a second conventional vertical MOSFET.

Now, description will be made of an embodiment of this invention with reference to the drawing.

Figure 3A:
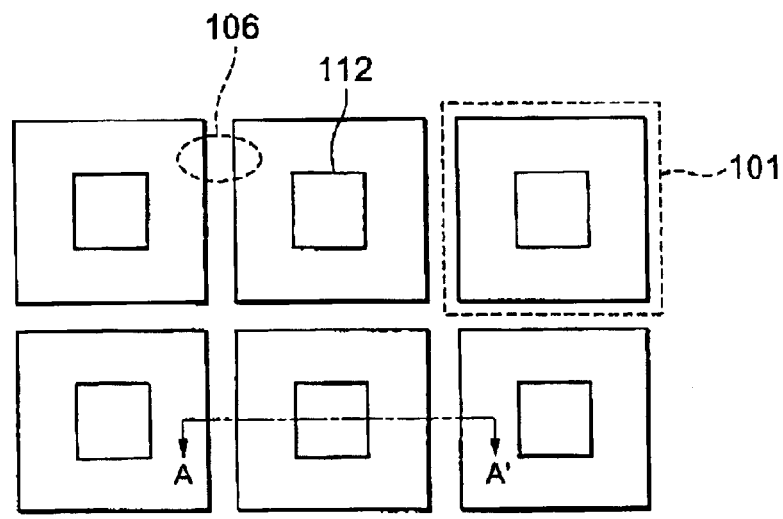
FIGS. 3A and 3B are plan views showing cell layouts in a vertical MOSFET according to this invention.
Figure 3B:
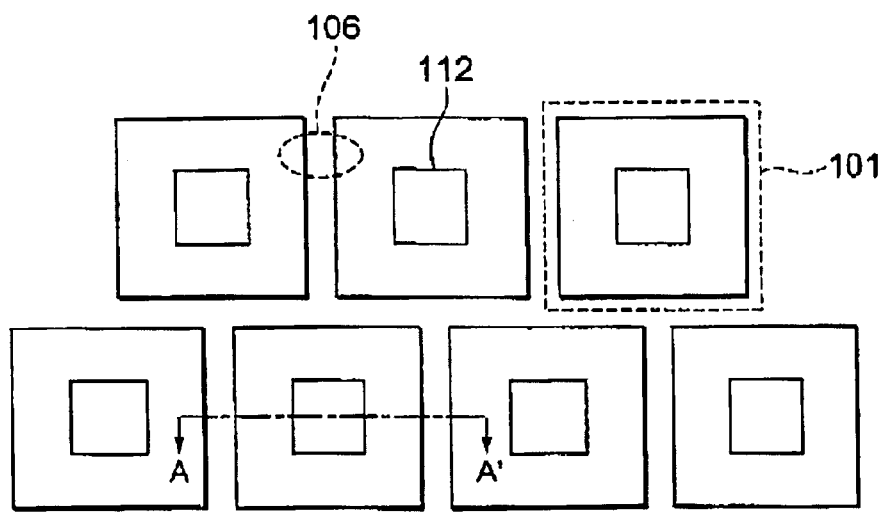
Figure 4A:
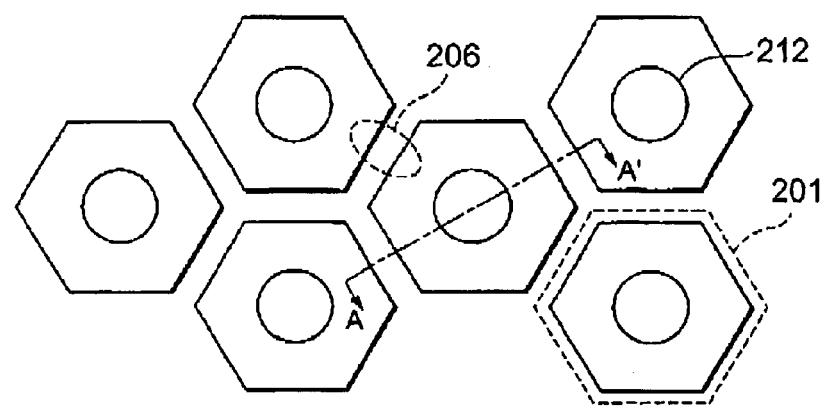
FIGS. 4A and 4B are plan views showing different cell layouts.
Figure 4B:
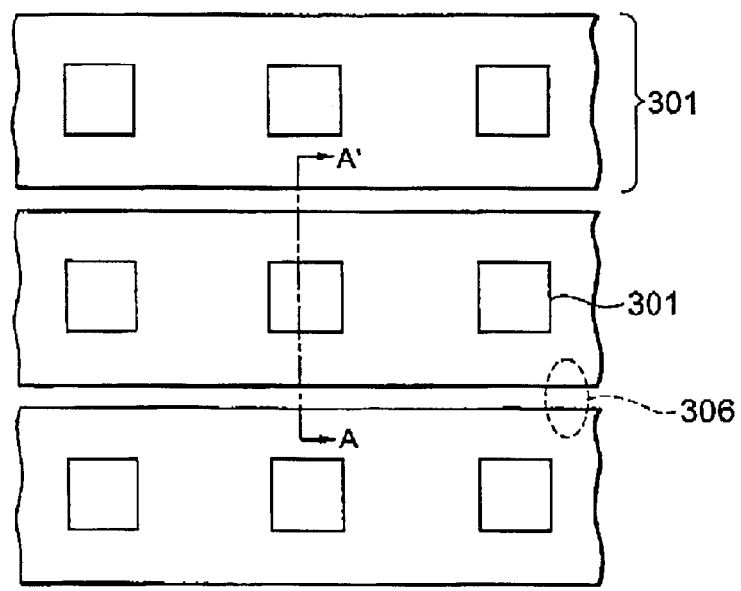

Referring to FIGS. 3A, 3B, 4A, and 4B, a UMOSFET chip may have various layouts of cells. In FIG. 3A, a plurality of square cells are arranged in a matrix. In FIG. 3B, the square cells are arranged in a matrix and the cells in adjacent lines are offset in position from each other. In FIG. 4A, a plurality of hexagonal cells are arranged. In FIG. 4B, a plurality of elongated cells are arranged in a column direction. As a matter of convenience, unit cells 101, 201, and 301 in each figure can be defined as structural units separated by trenches 106, 206, and 306 where gate electrodes are to be formed. At the centers of the unit cells 101, 201, and 301, contact holes 112, 212, and 312 are disposed, respectively. The contact holes may have any desired shape, such as a square shape, a hexagonal shape, an octagonal shape, and a circular shape. If the contact hole is sufficiently small, the contact hole has a generally circular shape without any angle, although depending upon the resolution of the photolithography. In each of the cells in these figures, a sectional structure taken along a line A–A' is similar. The sectional structure will be described in detail with reference to the drawing.

Figure 5A:
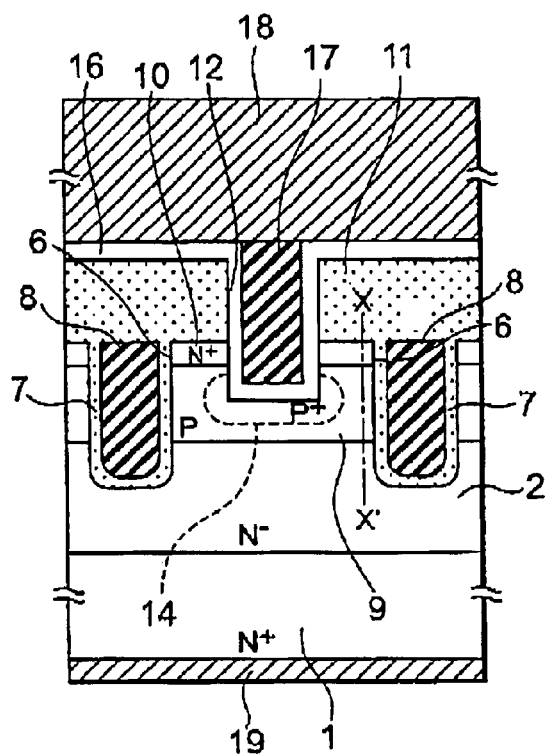
FIG. 5A is a sectional view of a vertical MOSFET according to a first embodiment of this invention, taken along a line A–A' in FIGS. 3A, 3B, 4A, and 4B.

Referring to FIG. 5A, a UMOSFET according to a first embodiment of this invention comprises an $N^+$-type silicon substrate 1 and an $N^-$-type epitaxial layer 2 formed on one surface of the $N^+$-type silicon substrate 1. A P-type base layer 9 and an $N^+$-type source layer 10 are formed on a surface of the $N^-$-type epitaxial layer 2. A combination of the substrate 1 and the layers 2, 9, and 10 constitutes a silicon layer having silicon surface opposite to each other. In each of trenches 6 reaching the $N^-$-type epitaxial layer 2 through the P-type base layer 9, a gate oxide film 7 and a polysilicon 8 are filled. On the polysilicon 8 to serve as a gate electrode or a trench gate, an interlayer oxide film 11 is formed. Between the trench gates adjacent to each other, a contact hole 12 having a predetermined depth is formed to reach the P-type base layer 9 through the $N^+$-type source layer 10. Directly under the contact hole 12, a barrier metal 16 is deposited to extend onto the interlayer oxide film 11. The contact hole 12, within which the barrier metal 16 is formed, is filled with W 17. On the surface of the W 17 and the barrier metal 16, a source electrode 18 is formed. On the other surface of the $N^+$-type silicon substrate 1, a drain electrode 19 is formed.

The UMOSFET described above is operable in the following manner. If a gate electrode (not shown) connected to the polysilicon 8 is applied with a voltage not lower than Vt, a portion of the P-type base layer 9 adjacent to each of the side walls of the trenches 6 is inverted to form a channel through which a drain current flows. More in detail, a current path during an on period includes the source electrode 18, the W 17, the barrier metal 16, the source layer 107 the above-mentioned channel region, the N⁻-type epitaxial layer 2, the N⁺-type silicon substrate 1, and the drain electrode 19. During an off period (in which the gate electrode is applied with no voltage), a high voltage can be applied between the drain electrode 19 and the source electrode 18. Mainly at a PN junction between the N⁻-type epitaxial layer 2 and the P-type base layer 9, a depletion layer is formed. Beyond a breakdown voltage, breakdown is caused to occur and an avalanche current flows between the drain and the source electrodes 18 and 19.

Referring to FIGS. 6A–6D, 7A–7D, and 8A–8C, description will be made of a method of producing the MOSFET in FIG. 5A. At first referring to FIG. 6A, the N⁻-type epitaxial layer 2 is grown on the one surface of the N⁺-type silicon substrate 1. Preferably, the N⁺-type silicon substrate 1 has a crystal surface (100) and is doped with As (arsenic) to have a concentration of $1 \times 10^{19}/cm^3$ to $8 \times 10^{19}/cm^3$. For example, the N⁺-type silicon substrate 1 has a thickness of 600–700 $\mu$m in case of a 6-inch wafer. The thickness and the impurity concentration of the N⁻-type epitaxial layer 2 must be determined depending upon the breakdown voltage and the on-resistance characteristic of the MOSFET. For example, the N⁻-type epitaxial layer has a thickness of about 5 $\mu$m and is doped with P (phosphorus) to have a concentration of about $2 \times 10^{16}/cm^3$.

Figure 6A:
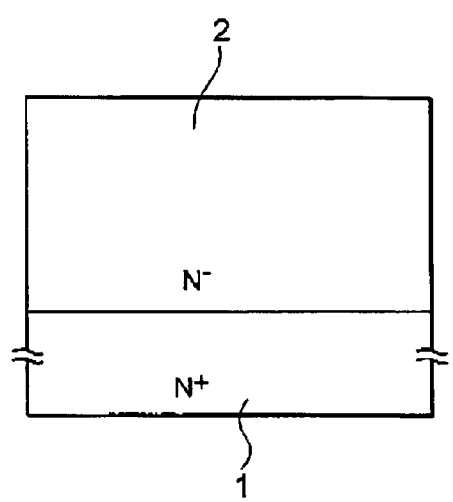
FIGS. 6A to 6D are sectional views for describing a first part of a method of producing the vertical MOSFET according to the first embodiment.
Figure 6B:
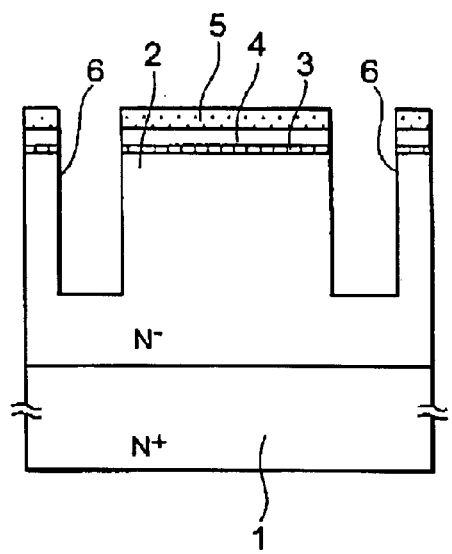

Next referring to FIG. 6B, an oxide film ($SiO_2$) 3 having a thickness of 10–50 nm is formed by thermal oxidation. Thereafter, a nitride film ($Si_3N_4$) 4 having a thickness of 100–200 nm and an oxide film 5 having a thickness of 100–200 nm are deposited by CVD. A composite film of the oxide film 3, the nitride film 4, and the oxide film 5 is patterned by photolithography. Then, with the composite film used as a mask, silicon etching is carried out to form the trenches 6 in the N⁻-type epitaxial layer 2. The depth and the width of each trench 6 and the distance between the adjacent trenches 6 must be selected to optimum sizes because the breakdown voltage and the on-resistance characteristic of the MOSFET depend thereupon. However, these sizes are also related to the state of formation of an impurity diffusion layer and have some degrees of freedom. In a recent fine process technique, it is possible to obtain the trench width not greater than 0.5 $\mu$m. Preferably, the trench depth is shallower than the thickness of the N⁻-type epitaxial layer 2 and deeper than the P-type base layer which will later be formed. For example, the trench depth is on the order of 1–1.5 $\mu$m. Preferably, the side wall of the trench 6 has an angle (taper angle) of 90° or less with respect to the bottom of the trench 6.

Figure 6C:
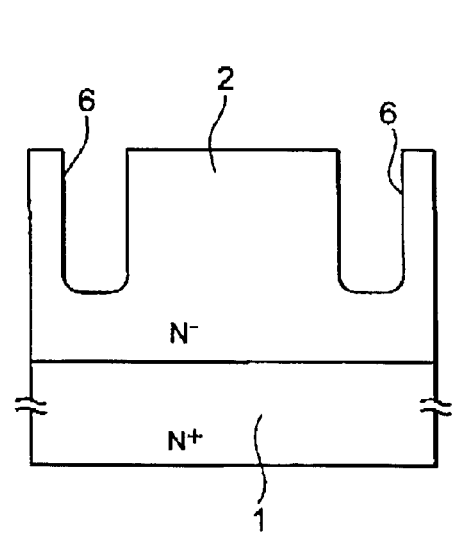

Next referring to FIG. 6C, after the composite film is removed by etching, corners of each trench 6 at the bottom are rounded. In this event, corners of each trench 6 at an opening portion may also be rounded. In order to round the corners, Japanese Unexamined Patent Publication No. H10-223891 (JP 10-223891 A) discloses a method comprising the steps of growing a sacrificial oxide film on a silicon surface in an oxygen atmosphere at about 1100° C. and thereafter removing the sacrificial oxide film by etching. Alternatively, another method of carrying out heat treatment in a hydrogen atmosphere at about 950° C. is used in order to round the corners (Sang-Gi Kim et al, "Trench corner rounding technology using hydrogen annealing for highly reliable trench DMOSFETs", Proceedings of International Symposium on Power Semiconductor Device and ICs, pages 87–90, 2000).

Figure 6D:
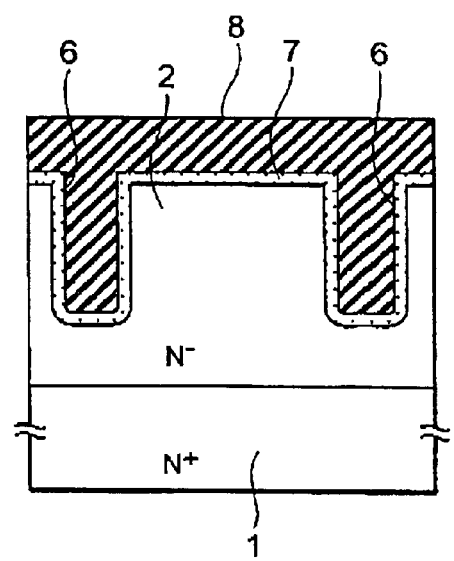

Next referring to FIG. 6D, the gate oxide film 7 having a thickness of 10–100 nm is formed by thermal oxidation on the surface of the N⁻-type epitaxial layer 2 and on inner surfaces of the trenches 6. Thereafter, the polysilicon 8 is deposited by CVD. In order to sufficiently fill the trenches 6 with the polysilicon 8, the thickness of the polysilicon 8 must be equal to or greater than an aperture width of the trenches 6. For example, in case where the trenches 6 have an aperture width of 0.35 $\mu$m, the polysilicon 8 must have a thickness of 0.35–0.7 $\mu$m, taken into account the fact that the aperture width may be increased as a result of the rounding operation of the trenches 6. The polysilicon 8 preferably has a low resistance because it is used as a gate electrode. After deposition, diffusion of P or As is carried out to provide a high-concentration N-type structure. Alternatively, deposition is carried out while doping these impurities.

Next referring to FIG. 7A, the polysilicon 8 is etched back to be left only in the interior of each of the trenches 6. It is noted here that, in a MOSFET chip structure, extraction of the gate electrode by the polysilicon 6 is required. Although not shown in the figure, patterning by photolithography is required in an area except a cell region. Subsequently, implantation of B (boron) or $BF_2$ (boron fluoride) ions and heat treatment in an oxygen atmosphere or a nitrogen atmosphere are carried out to form the P-type base layer 9 to the depth shallower than the trenches 6. For example, the B ions are implanted with the energy of 30–80 keV and at a dose of $5 \times 10^{12}/cm^2$ to $5 \times 10^{13}/cm^2$ and the heat treatment at 1100–1150° C. for several tens of minutes is carried out. As a result, the P-type base layer 9 having a depth on the order of 0.5–1.5 $\mu$m is formed. Furthermore, the N⁺-type source layer 10 is formed on the surface of the P-type base layer 9 by implantation of As ions and heat treatment in a nitrogen atmosphere. For example, the As ions are implanted with the energy of 30–100 keV and at a dose of $1 \times 10^{15}/cm^2$ to $5 \times 10^{16}/cm^2$ and the heat treatment is carded out at 800–900° C. for several minutes to several tens of minutes. Then, the N⁺-type source layer 10 is formed to the depth on the order of 0.1–0.5 $\mu$m. Before implantation of the B or the As ions, the gate oxide film 7 is left on the silicon surface. In conformity with the ion implanting condition, the oxide film may be reformed (for example, changed in thickness).

Figure 5B:
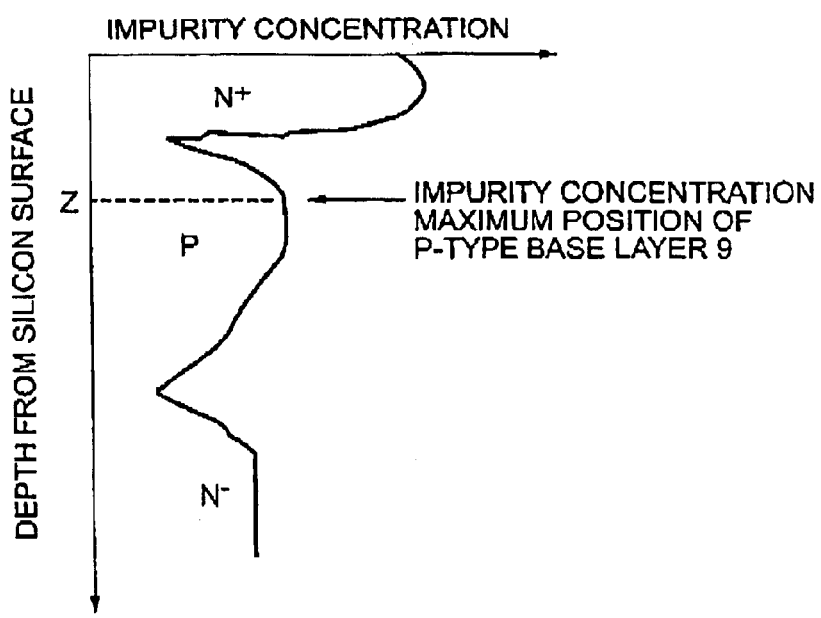
FIG. 5B shows an impurity concentration profile taken along a line X–X' in FIG. 5A.

Next referring to FIG. 7B, the interlayer oxide film 11 is deposited by CVD to the thickness of 0.5–1 $\mu$m. Generally, the interlayer oxide film comprises $SiO_2$ or BPSG (borophosphosilicate glass) using a TEOS (tetra ethoxy silane) gas. Next referring to FIG. 7C, patterning is carried out by photolithography and the interlayer oxide film 11 is etched. The silicon is etched to the depth reaching the P-type base layer 9 through the interlayer oxide film 11 and the N⁺-type source layer 10. Thus, the contact hole 12 is formed. Herein, a depth d from a silicon surface of a silicon layer (1, 2, 9, and 10) (that is, a top surface of the N⁺-type source layer 10) to the bottom of the contact hole 12 is preferably different from the peak depth z in an impurity concentration profile of the p-type base layer 9 in FIG. 5B taken along the line X–X' in FIG. 5A. That is, the peak depth z is defined as a position having a maximum impurity-concentration (or a peak impurity-concentration) in a depth direction of the p-type base layer 9. In particular, the depth d preferably falls within a range given by $d < z - 0.1\ \mu m$ or $d > z + 0.1\ \mu m$.

Figure 9A:
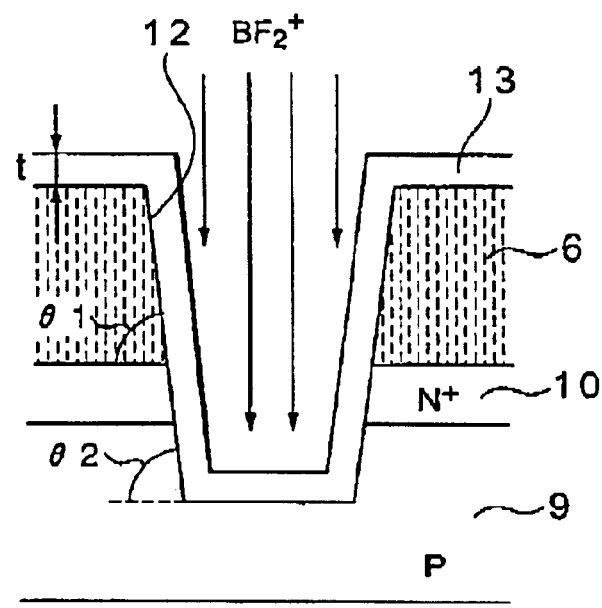
FIGS. 9A and 9B are schematic sectional views for describing ion implantation into a contact hole.

Temporarily referring to FIG. 9A, in the contact hole 12, the top surface of the N⁺-type source layer 10 as the silicon surface and the contact hole 12 form a taper angle θ1 preferably smaller than 90° (θ1<90°). The bottom and the side wall of the contact hole 12 form a taper angle θ2 preferably smaller than 90° (θ2<90°). The taper angles within the above-mentioned range are favorable taking into account the coverage when the source electrode or a filling material connected thereto is filled later. As the angles θ1 and θ2 are smaller, filling is easy. However, if the angles θ1 and θ2 are excessively small, a void is produced in the filling material. Furthermore, a space between the trench 6 and the contact hole 12 is narrowed so that gate-source short circuiting will easily be caused to occur. In view of the above, the allowable ranges are θ1>80° and θ2>80°.

Next referring to FIG. 7D, an oxide film 13 is deposited by CVD to the thickness of 5–30 nm. Thereafter, implantation of $BF_2$ ions and activation by heat treatment in a nitrogen atmosphere are carried out to form a $P^+$-type base contact layer 14 under the bottom of the contact hole 12. At this time, if the heat treatment is excessive, the impurity diffuses in a lateral direction and a downward direction so that the $P^+$-type base contact layer is spread. Therefore, it is necessary to suppress the heat treatment time and the heat treatment temperature to a shortest time and to a lowest temperature required to activate the ions. For example, the $BF_2$ ions are implanted with the energy of 15–80 keV and at a dose of $5\times10^{14}/cm^2$ to $5\times10^{15}/cm^2$. The heat treatment at 800–900° C. for several minutes to several tens of minutes or RTA (Rapid Thermal Annealing) at 900–1050° C. for several seconds to several tens of seconds is carried out.

Figure 8A:
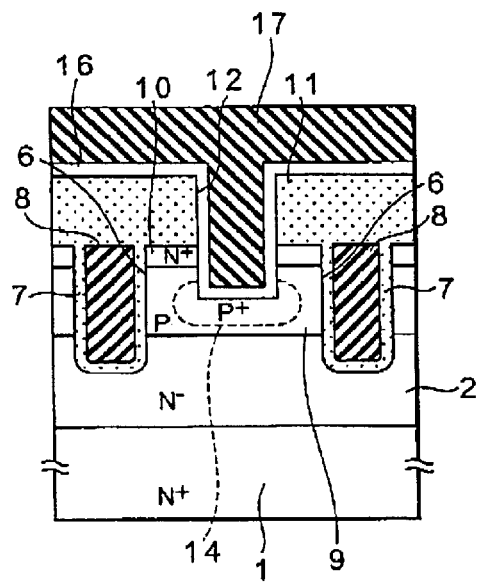
FIGS. 8A to 8C are sectional views for describing a third part of the production process following the second part.
Figure 8B:
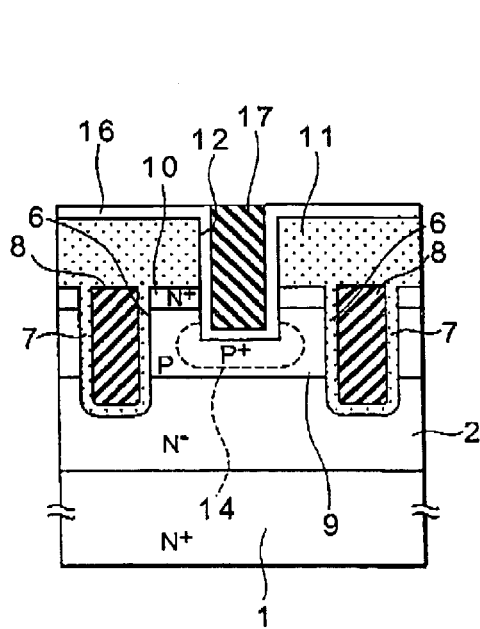
Figure 8C:
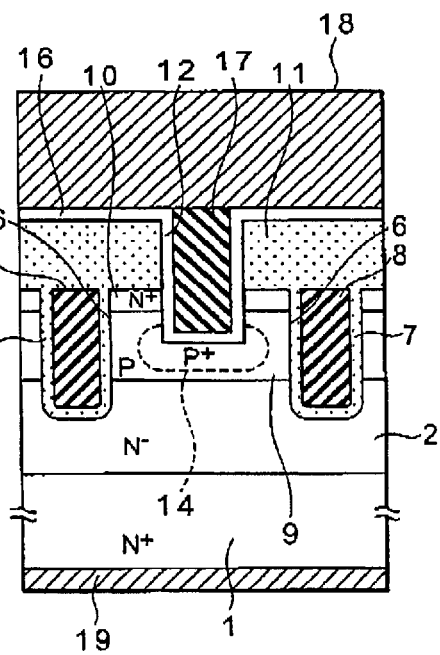

After the oxide film 13 is removed, the barrier metal 16 comprising Ti and TiN (titanium nitride) is deposited by sputtering as illustrated in FIG. 8A. Thereafter, the W 17 is deposited by CVD. The thickness of the W 17 is not smaller than the aperture width of the contact hole 12. Next referring to FIG. 8B, the W 17 is etched back to be left in the contact hole 12 in a plug-like shape. Next referring to FIG. 8C, AlSi (aluminum silicon) or AlSiCu (aluminum copper silicon) is deposited by sputtering to form the source electrode 18. The source electrode 18 is preferably as thick as possible in order to reduce the resistance component of AlSi or AlSiCu. Practically, the source electrode 18 has a thickness on the order of 4–6 μm. In the MOSFET chip structure, AlSi or AlSiCu is used not only as the source electrode 18 but also as a gate electrode connected to the polysilicon 8. Therefore, in an area except the cell region, patterning by photolithography and etching are required (not shown). Subsequently, a covering material such as PSG (phosphosilicate glass) or a nitride film is deposited as a surface protection film. In order to form a bonding region, patterning by photolithography and etching are carried out (not shown). Finally, the other surface of the $N^+$-type silicon substrate 1 is ground by a desired thickness. Several kinds of metals are deposited by vapor deposition to form the drain electrode 19.

According to the first embodiment, the depth d of the contact hole 12 from the first surface of the semiconductor substrate is different from the peak depth z of the impurity concentration of the P-type base layer 9 from the silicon surface of silicon layer (1, 2, 9, and 10). Specifically, the depth d and the impurity concentration peak depth z have the relationship given by $d<z-0.1$ μm or $d>z+0.1$ μm. Therefore, even if the impurity diffusion layer 14 for the base contact formed at the bottom of the contact hole 12 is spread by the heat treatment in the downward direction and the lateral direction, it is possible to reduce a space between the trench 6 as the gate electrode and the contact hole 12 without changing the impurity concentration peak in the channel region which has an influence upon Vt. Thus, it is possible to effectively reduce the cell size. According to the experimental study of the present inventor, it has been found out that, in the MOSFET having a particular breakdown voltage, a favorable result was obtained at $d=z-0.1$ μm or $d=z+0.1$ μm. Although the depth d is changed in case where the breakdown voltage of the MOSFET is different, a favorable result is obtained within the above-mentioned range. It is noted here that, if the depth d of the contact hole 12 is beyond the above-mentioned range with respect to the impurity concentration peak depth z of the P-type base layer 9, particularly in case where the space between the trench 6 and the contact hole 12 is narrow, the impurity concentration peak becomes high due to the diffusion of the impurity diffusion layer 14 for the base contact, affecting the impurity concentration in the channel region to thereby increase Vt.

The depth d of the contact hole 12 must be greater than the depth of the $N^+$-type source layer 10. In particular, the impurity concentration at the bottom of the source layer 10 may be cancelled by the P-type base layer 9 having an inverted conductive type so that the source resistance R(N+) is elevated. Therefore, the depth d of the contact hole 12 is preferably deeper than the depth of the source layer 10 plus 0.1 μm. The depth d can be increased to reach a junction between the P-type base layer 9 and the $N^-$-type epitaxial layer 2 at maximum. However, since a space between the junction and the bottom of the contact hole 12 is concerned with the source-drain breakdown voltage, the depth d is preferably shallower than the depth of the junction by about 0.3 μm.

In the first embodiment, production is carried out so that the taper angle θ2 of the contact hole 12, the thickness t of the oxide film formed when the impurities are ion implanted into the contact hole 12, and a range $(Rp+\Delta Rp)$ of ions to be implanted satisfy the relationship given by $(Rp+\Delta Rp)<t/\cos(\theta 2)$. Therefore, even in case where the contact hole 12 is formed in the P-type base layer 9 to a predetermined depth, the impurity diffusion layer 14 for the base contact is not present on the side wall of the contact hole 12. Thus, it is possible to suppress the increase in source-contact resistance and to suppress the increase in on-resistance. In other words, if a part of the source diffusion layer 14 is diffused to the side wall of the contact hole 12, the source-contact resistance is increased to result in an increase in on-resistance. The impurity diffused to the side wall of the contact hole 12 is further diffused to the channel region, resulting in an increase in Vt.

In the first embodiment, the W 17 is filled in the contact hole 12 as a plug. On the W 17, the source electrode 18 is formed. Therefore, the source electrode 18 finally has a flat surface. Accordingly, the resistance component of the source electrode 18 can be reduced. In addition, the source electrode 18 having a flat surface assures a wide contact area in wire bonding or clip bonding carried out for the surface so that a total on-resistance after mounting can be reduced. Furthermore, it is possible to perform chip mounting by bump connection, which is difficult when the source electrode has an irregular surface.

In the first embodiment, it is assumed that the taper angle in the contact hole 12 formed in the step of FIG. 7C falls within a range of 90°>θ2>80°. Let the implantation angle of the $BF_2$ ions be equal to 0°. In this event, the thickness t of the oxide film 13 to be formed after the step of FIG. 7C and the range $(Rp+\Delta Rp)$ (including diffusion) of the ions with respect to the implanted energy must be selected to satisfy the relationship given by $(Rp+\Delta Rp)<t/\cos(\theta 2)$. For example, if θ2>80° and t=10 nm, the oxide film 13 on the side wall of the contact hole 12 has a thickness of about 57.6 nm at maximum in the orthogonal direction. Therefore, if the implanted energy is 45 keV, (Rp+ΔRp)≈(36+17)=53 nm. As a consequence, ion implantation to the side wall is not carried out.

Figure 10:
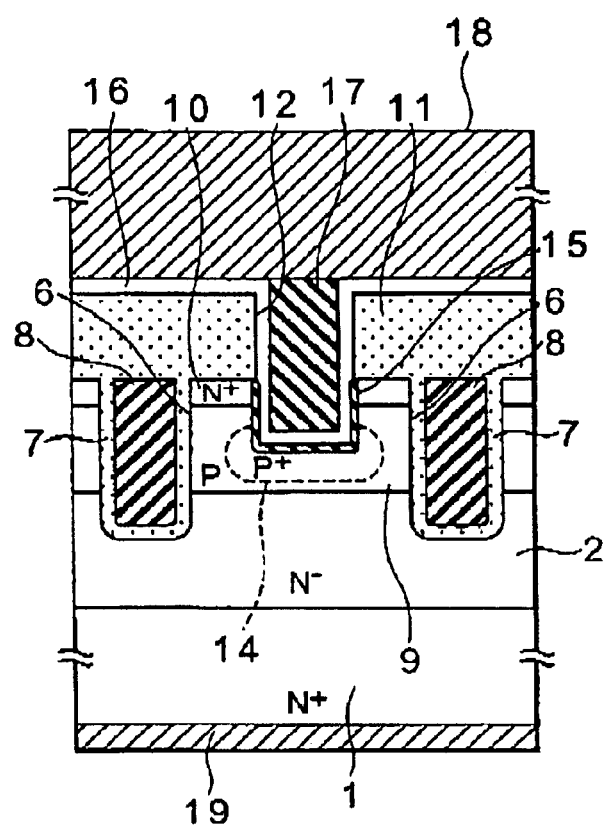
FIG. 10 is a sectional view of a vertical MOSFET according to a second embodiment of this invention, taken along a line A–A' in FIGS. 3A, 3B, 4A, and 4B.

Referring to FIG. 10, a UMOSFET structure according to a second embodiment of this invention will be described. Similar parts are designated by like reference numerals and will not be described further. The second embodiment is different from the first embodiment in that a silicide layer 15 is formed on the bottom and the side wall of the contact hole 12, i.e., at a portion brought into contact with the P-type base layer 9 and the N$^+$-type source layer 10.

Figure 9B:
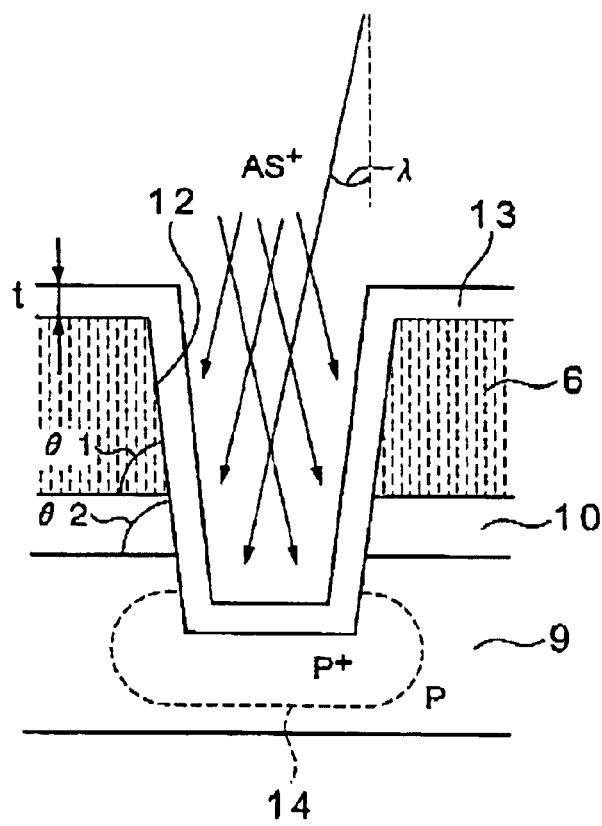

Referring to FIGS. 11A to 11D, description will be made of a method of producing the UMOSFET illustrated in FIG. 10. The steps in FIGS. 6A through 7C in the first embodiment are carried out. Then, as shown in FIG. 7D, As ions are implanted through the oxide film 13 at a dose on the order of 1×10$^{14}$/cm$^2$ to 3×10$^{14}$/cm$^2$. Thus, the surfaces of the N$^+$-type source layer 10, the P$^+$-type base contact layer 14, and the P-type base layer 9 are amorphousized. Thereafter, the oxide film 13 is removed by etching. Herein, it is important to amorphousize not only the bottom of the contact hole 12 but also the side wall thereof. Referring to FIG. 9B, the taper angle θ2 in the contact hole 12, the thickness t of the oxide film 13, and the implantation angle λ of the As ions are selected so that the relationship (Rp+ΔRp)>t/sin(λ) is satisfied. For example, if θ2<90°, t=10 nm, and λ>10°, the oxide film 13 on the side wall of the contact hole 12 has a thickness of about 57.6 nm at maximum in the orthogonal direction. Therefore, if the implanted energy is 100 keV, (Rp+ΔRp)≈(47+15)=62 nm. Therefore, ion implantation of As ions is carried out to the side wall. In order to implant the As ions throughout the side wall of the contact hole 12, implantation is carried out while rotating a stage for holding a semiconductor structure having the contact hole 12.

Figure 11A:
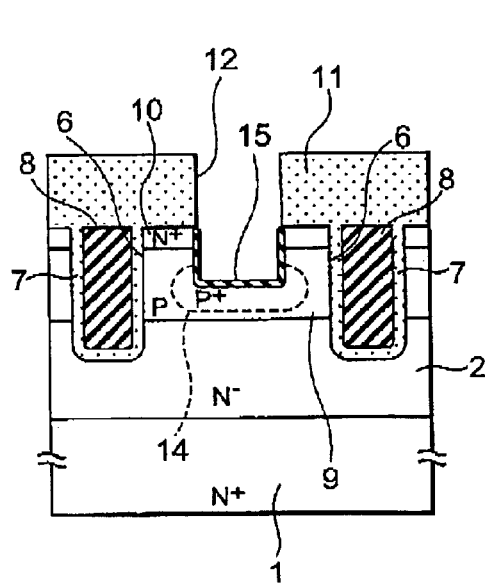
FIGS. 11A to 11D are sectional views for describing a method of producing the vertical MOSFET illustrated in FIG. 10.
Figure 11B:
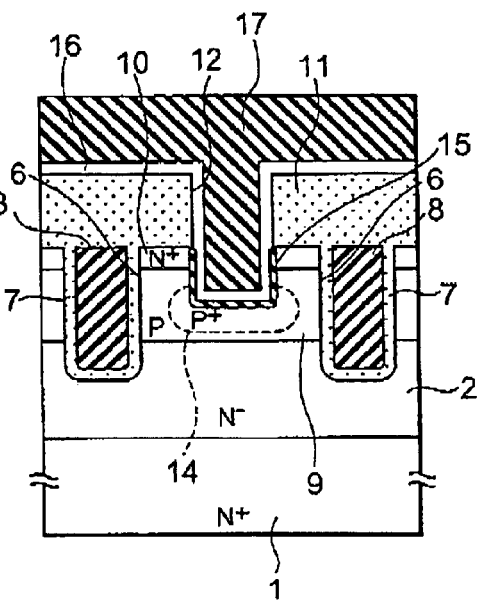
Figure 11C:
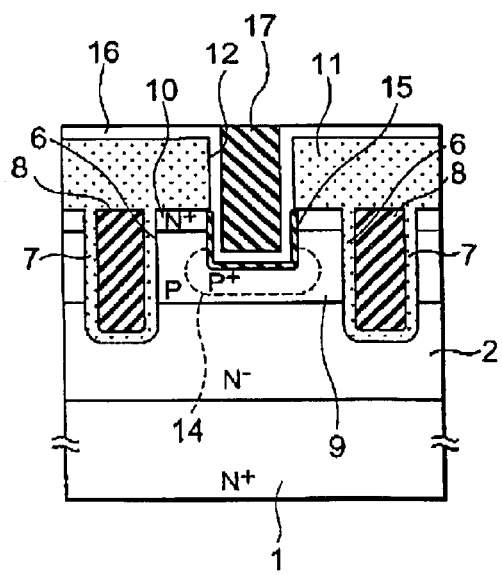
Figure 11D:
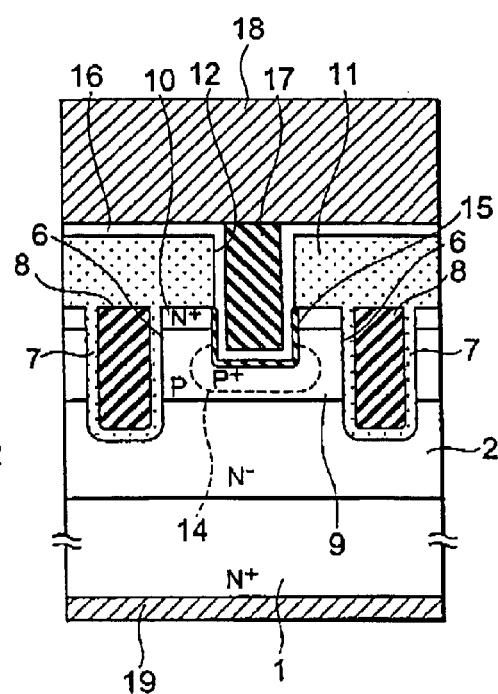

Next referring to FIG. 11A, Ti is deposited by sputtering. Silicide reaction between silicon and Ti is caused by RTA (rapid thermal annealing). An excessive Ti is removed by etching. Thus, the silicide (titanium silicide) 15 is formed. For example, a series of silicide-forming steps can be implemented by a common technique used in an LSI process having a design rule of 0.35 μm. In order to improve the coverage of Ti, use may be made of CVD. Thereafter, the steps illustrated in FIGS. 11B to 11D are carried out to complete the UMOSFET. These steps are same as those illustrated in FIGS. 8A to 8C in the first embodiment and will not be described in detail.

In the second embodiment, the silicide 15 is formed on the bottom and the side wall of the contact hole 12. Therefore, as compared with the first embodiment, an increase in source contact resistance at the side wall of the contact hole 12 can be suppressed by the suicide 15. The depth d of the contact hole 12 is selected to be similar to that in the first embodiment and the base contact layer 14 is not formed on the side wall of the contact hole 12. Furthermore, the surface of the source electrode 18 is flattened. Therefore, like in the first embodiment, it is possible to effectively reduce the cell size without affecting Vt, to reduce the total on-resistance after mounting by increasing the contact area in bonding for mounding, and to carry out chip mounting by bump connection.

In each of the first and the second embodiments, description has been directed to the N-channel MOSFET structure. However, by inverting the conductive type, this invention is also applicable to a P-channel MOSFET structure. In the UMOSFET of this invention, the trench need not have a U shape but may be a V shape or a rectangular shape approximate thereto.

As described above, the depth of the contact in the UMOSFET is different from the impurity concentration peak depth of the base layer. Thus, it is possible to suppress the influence upon the channel region by the impurity of the base contact layer formed at the bottom of the contact and to reduce the cell size without increasing Vt. Furthermore, since the base contact layer is not present on the side wall of the contact, the source layer resistance is never increased. In addition, the surface of the source electrode can be flattened so that the bonding resistance can be reduced.

What is claimed is:

1. A vertical MOSFET comprising: a semiconductor layer (1, 2, 9, 10) having first and second surfaces opposite to each other and a pair of trenches (6) formed on said first surface; a pair of trench gates (8) formed in said pair of trenches; a unit cell formed in a region of said semiconductor layer surrounded by said pair of trench gates, said unit cell comprising a base layer (9) and a source layer (10) formed on said base layer and having said first surface as a principal semiconductor surface, said unit cell having a contact hole (12) formed on a center of said principal semiconductor surface and extending from said principal semiconductor surface through said source layer to an inside of said base layer; a contact (17) formed in said contact hole; a source electrode (18) formed on said contact; and a drain electrode (19) formed on said second surface; wherein said contact is formed to a depth different to a peak depth which is a position having a maximum impurity-concentration in a depth direction of said base layer, said unit cell further comprising a base contact layer (14) formed within said base layer so as to enclose a bottom of said contact and to bring said base contact layer into contact with the bottom of said contact.

2. A vertical MOSFET as claimed in claim 1, wherein d and z have a relationship given by d<z−0.1 μm or d>z+0.1 μm, where d represents the depth of said contact from said principal semiconductor surface and where z represents the peak depth from said principal semiconductor surface.

3. A vertical MOSFET as claimed in claim 1, wherein said base contact layer is formed within said base layer so as to enclose only the bottom of said contact and to bring said base contact layer into contact with only the bottom of said contact.

4. A vertical MOSFET as claimed in claim 1, wherein said contact hole is with a metal which serves as said contact and has a flattened surface, said source electrode being formed on the flattened surface of said metal and having another flattened surface.

5. A vertical MOSFET as claimed in claim 1, wherein said unit cell further comprising a metal silicide (15) formed between the bottom of said contact and said base contact layer, between a side wall of said contact and said source layer, and between the side wall of said contact and said base layer.

6. A vertical MOSFET as claimed in claim 1, wherein said contact hole has a tapered shape gradually decreased in aperture size from said first surface towards said second surface.

* * * * *